(12) United States Patent
Sato (10) Patent No.: US 10,784,177 B2
(45) Date of Patent: Sep. 22, 2020

(54) SEMICONDUCTOR DEVICE WITH ENCAPSULATING RESIN

(71) Applicant: SHINKO ELECTRIC INDUSTRIES CO., LTD., Nagano (JP)

(72) Inventor: Seiji Sato, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/380,166

(22) Filed: Apr. 10, 2019

(65) Prior Publication Data

US 2019/0326189 A1  Oct. 24, 2019

(30) Foreign Application Priority Data

Apr. 18, 2018 (JP) .................. 2018-079689

(51) Int. Cl.
*H01L 23/31* (2006.01)
*H01L 21/56* (2006.01)
*H01L 23/00* (2006.01)

(52) U.S. Cl.
CPC ........ *H01L 23/3121* (2013.01); *H01L 21/563* (2013.01); *H01L 21/565* (2013.01); *H01L 23/3107* (2013.01); *H01L 24/17* (2013.01); *H01L 2224/0603* (2013.01); *H01L 2224/0801* (2013.01); *H01L 2224/08135* (2013.01); *H01L 2224/08151* (2013.01); *H01L 2224/16227* (2013.01); *H01L 2224/1703* (2013.01)

(58) Field of Classification Search
CPC . H01L 21/563; H01L 21/565; H01L 23/3121; H01L 23/3107; H01L 24/17; H01L 2224/0801; H01L 2224/08135; H01L 2224/08151; H01L 2224/16227; H01L 2224/0603; H01L 2224/1703
See application file for complete search history.

(56) References Cited

U.S. PATENT DOCUMENTS

| | | | |
|---|---|---|---|
| 6,443,351 B1 * | 9/2002 | Huang ................. | B23K 3/0623 228/103 |
| 7,714,437 B2 * | 5/2010 | Naya ................. | H01L 27/14683 257/737 |
| 8,716,872 B2 * | 5/2014 | Kwon .................. | H01L 25/105 257/777 |

(Continued)

FOREIGN PATENT DOCUMENTS

JP  2015-071670  4/2015

*Primary Examiner* — Joseph C. Nicely
(74) *Attorney, Agent, or Firm* — IPUSA, PLLC (57) ABSTRACT

A semiconductor device includes an interconnect substrate having a plurality of pads formed on a first surface thereof, a semiconductor chip having a plurality of electrodes formed on a circuit surface thereof, the semiconductor chip being mounted on the interconnect substrate such that the circuit surface faces the first surface, a plurality of bonding members that are made of a same material and that electrically couple the pads and the electrodes, and a resin disposed on the first surface to encapsulate the semiconductor chip and to fill a gap between the circuit surface and the first surface, wherein the semiconductor chip is mounted on the interconnect substrate such that the gap between the circuit surface and the first surface progressively increases from a first side to a second side.

4 Claims, 8 Drawing Sheets

(56) References Cited

U.S. PATENT DOCUMENTS

| | | | |
|---|---|---|---|
| 8,970,051 B2* | 3/2015 | Shi | H01L 25/0657 257/686 |
| 2003/0127747 A1* | 7/2003 | Kajiwara | H01L 24/02 257/778 |
| 2006/0157870 A1* | 7/2006 | Kato | H01L 24/10 257/780 |
| 2009/0121334 A1* | 5/2009 | Oi | H01L 21/6835 257/678 |
| 2011/0233767 A1* | 9/2011 | Sakurai | H01L 23/49811 257/737 |
| 2011/0278056 A1* | 11/2011 | Takeuchi | H01L 21/4853 174/261 |
| 2012/0241955 A1* | 9/2012 | Law | H01L 24/81 257/738 |
| 2014/0167254 A1* | 6/2014 | Yu | H01L 24/13 257/737 |
| 2014/0264337 A1* | 9/2014 | Chen | H01L 23/528 257/48 |
| 2014/0299986 A1* | 10/2014 | Sakurai | H01L 24/13 228/180.22 |
| 2016/0005707 A1* | 1/2016 | Kwon | H01L 24/14 257/737 |
| 2016/0079195 A1* | 3/2016 | Tanaka | H01L 24/32 257/737 |
| 2016/0351607 A1* | 12/2016 | Liu | H01L 27/14618 |

\* cited by examiner

SEMICONDUCTOR DEVICE WITH ENCAPSULATING RESIN

CROSS-REFERENCE TO RELATED APPLICATIONS

The present application is based upon and claims the benefit of priority from the prior Japanese Patent Application No. 2018-079689 filed on Apr. 18, 2018, with the Japanese Patent Office, the entire contents of which are incorporated herein by reference.

FIELD

The disclosures herein relate to semiconductor devices and methods of producing a semiconductor device.

BACKGROUND

There is a known technology in which a semiconductor chip is mounted on an interconnect substrate in a flip-chip manner, and the gap between the semiconductor chip and the interconnect substrate is filled with an underfill resin, with the semiconductor chip being encapsulated in a resin such as a mold resin.

There is also a technology in which a semiconductor chip is mounted on an interconnect substrate in a flip-chip manner, and a mold resin or the like is used for encapsulation without using an underfill resin, so that the gap between the semiconductor chip and the interconnect substrate is also filled with a mold resin or the like. This technology is referred to as "mold underfill".

When a semiconductor chip is mounted on an interconnect substrate in a flip-chip manner, the semiconductor chip may sometimes be mounted with an irregular tilt.

The tilting of the semiconductor chip creates uneven gap lengths between the semiconductor chip and the interconnect substrate. When the semiconductor chip is encapsulated with a resin such as a mold resin, the flow of resin may be such that the resin flows into the gap from the side where the gap is narrower. Such a tilting direction is not preferable from the viewpoint of reliability of resin injection. As a result, the reliability of resin injection into the gap between the semiconductor chip and the interconnect substrate is reduced, which may result in the resin not being fully injected into the gap between the semiconductor chip and the interconnect substrate.

Accordingly, there may be a need to provide a semiconductor device for which the reliability of resin injection into the gap between a semiconductor chip and an interconnect substrate is improved.

RELATED-ART DOCUMENTS

Patent Document

[Patent Document 1] Japanese Patent Application Publication No. 2015-71670

SUMMARY

According to an aspect of the embodiment, a semiconductor device includes an interconnect substrate having a plurality of pads formed on a first surface thereof, a semiconductor chip having a plurality of electrodes formed on a circuit surface thereof, the semiconductor chip being mounted on the interconnect substrate such that the circuit surface faces the first surface, a plurality of bonding members that are made of a same material and that electrically couple the pads and the electrodes, and a resin disposed on the first surface to encapsulate the semiconductor chip and to fill a gap between the circuit surface and the first surface, wherein the semiconductor chip is mounted on the interconnect substrate such that the gap between the circuit surface and the first surface progressively increases from a first side to a second side.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments will be described by referring to the accompanying drawings. In these drawings, the same elements are referred to by the same references, and a duplicate description thereof may be omitted.

First Embodiment

Structure of Semiconductor Device of First Embodiment

Figure 1A:
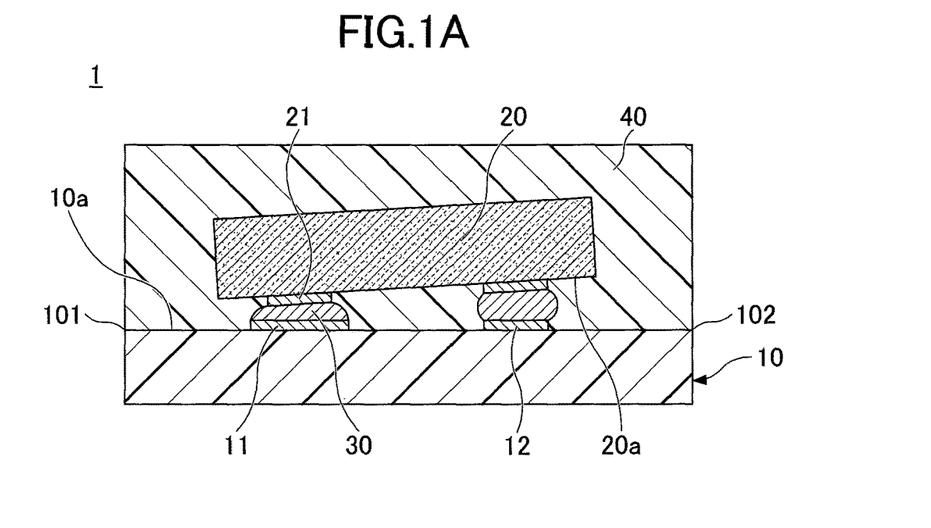
FIGS. 1A and 1B are drawings illustrating an example of a semiconductor device according to a first embodiment.
Figure 1B:
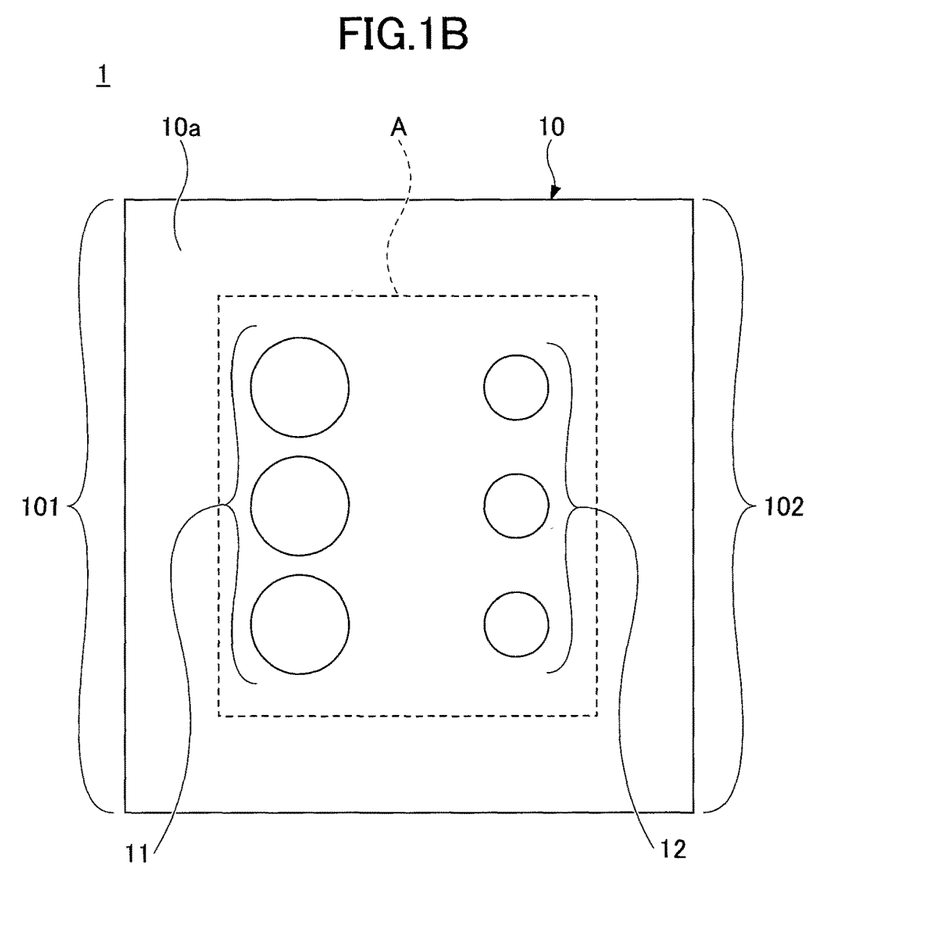

In the following, a description will be first given of the structure of a semiconductor device of a first embodiment. FIGS. 1A and 1B are drawings illustrating an example of the semiconductor device according to the first embodiment. FIG. 1A illustrates a cross-sectional view, and FIG. 1B illustrates a plan view of an interconnect substrate 10 and pads 11 and 12 shown in FIG. 1A.

In FIG. 1A, a semiconductor device 1 of the first embodiment includes an interconnect substrate 10, a semiconductor chip 20, solder bumps 30, and an encapsulating resin 40.

In the present embodiment, for the sake of convenience, the side of the semiconductor device 1 on which the encapsulating resin 40 is situated is referred to as an upper side or a first side, and the side on which the interconnect substrate 10 is situated is referred to as a lower side or a second side. A surface (or face) of a given member that faces toward the upper side is referred to as a first surface (or first face) or an upper surface (or upper face), and a surface (or face) of the given member that faces toward the lower side is referred to as a second surface (or second face) or a lower surface (or lower face). It may be noted, however, that the semiconductor device 1 may be used in an upside-down position, or may be placed at any angle. Further, a plan view refers to a view taken in the direction normal to a first surface 10a of the interconnect substrate 10, and a plan shape is a shape as viewed in the direction normal to the first surface 10a of the interconnect substrate 10.

The interconnect substrate 10 is not limited to a particular type as long as the semiconductor chip 20 is mountable thereon. A coreless buildup substrate or a cored buildup substrate may be employed, for example. The interconnect substrate 10 may have any number of interconnect layers and insulating layers according to need. The plan view shape of the interconnect substrate 10 may be rectangular, for example.

A semiconductor-chip mount area A of the first surface 10a of the interconnect substrate 10 has a plurality of pads formed therein. Specifically, the pads 11 are aligned approximately parallel to an edge 101 of the interconnect substrate 10 in the proximity of the edge 101, and the pads 12 are aligned approximately parallel to an edge 102 of the interconnect substrate 10 in the proximity of the edge 102, which is on the opposite side of the interconnect substrate 10 from the edge 101. Three pads 11 and three pads 12 are arranged in this non-limiting example. The numbers of pads 11 and 12 may be determined by taking into account the specifications of the semiconductor chip 20 on which these pads are mounted.

The plurality of pads formed on the first surface 10a of the interconnect substrate 10 have contact surfaces (upper surfaces) that vary in area and that are bonded to the solder bumps. Specifically, the area of the contact surfaces of the pads 12 arranged along the edge 102 is smaller than the area of the contact surfaces of the pads 11 arranged along the edge 101. The plan view shape of the pads 11 and the pads 12 may be circular, for example. In this case, the pads 12 have a smaller diameter than the pads 11. The technological significance of this arrangement in which pads having contact surfaces with varying areas are disposed on the first surface 10a of the interconnect substrate 10 will be described later.

In the case in which the pads are covered with a solder resist layer or the like, an exposed area of the pad upper surface exposed through an opening of the solder resist layer or the like is regarded as the contact surface area of the pads.

The semiconductor chip 20 is mounted on the first surface 10a of the interconnect substrate in a flip-chip manner such that the distance between a circuit surface 20a and the first surface 10a progressively increases away from the edge 101 toward the edge 102.

Specifically, a plurality of electrodes 21 are formed on the circuit surface 20a of the semiconductor chip 20. The electrodes 21 have contact surfaces (i.e., lower surfaces) that are bonded to the solder bumps and that have a constant area. The plan shape of each electrode 21 may be circular, for example. The electrodes 21 situated to face the respective pads 11 are electrically coupled to the pads 11 through the solder bumps 30. The electrodes 21 situated to face the respective pads are electrically coupled to the pads 12 through the solder bumps 30.

The solder bumps 30 are bonding members for electrically coupling the pads 11 or 12 with the electrodes 21. All the solder bumps 30 are made of the same material. The thickness of the solder bumps 30 on the pads 11 is less than the thickness of the solder bumps 30 on the pads 12. An alloy including Pb, an alloy of Sn and Cu, an alloy of Sn and Ag, or an alloy of Sn, Ag, and Cu may be used as a material to form the solder bump 30.

The encapsulating resin 40 is disposed on the first surface 10a of the interconnect substrate 10 to encapsulate the semiconductor chip 20 and to fill the gap between the circuit surface 20a and the first surface 10a. Namely, the encapsulating resin 40 also serves as an underfill resin to fill the gap between the circuit surface 20a and the first surface 10a. The encapsulating resin 40 may be made of an epoxy-based resin or the like (i.e., a mold resin) that has sufficient stiffness, for example. The fluidity and stiffness of the epoxy-based resin may be controlled by adjusting the composition of resin, the type and amount of contained filler, etc.

Method of Making Semiconductor Device of First Embodiment

In the following, a method of making a semiconductor device according to the first embodiment will be described. FIGS. 2A through 2C through FIGS. 4A to 4C are drawings illustrating examples of process steps for making a semiconductor device according to the first embodiment.

Figure 2A:
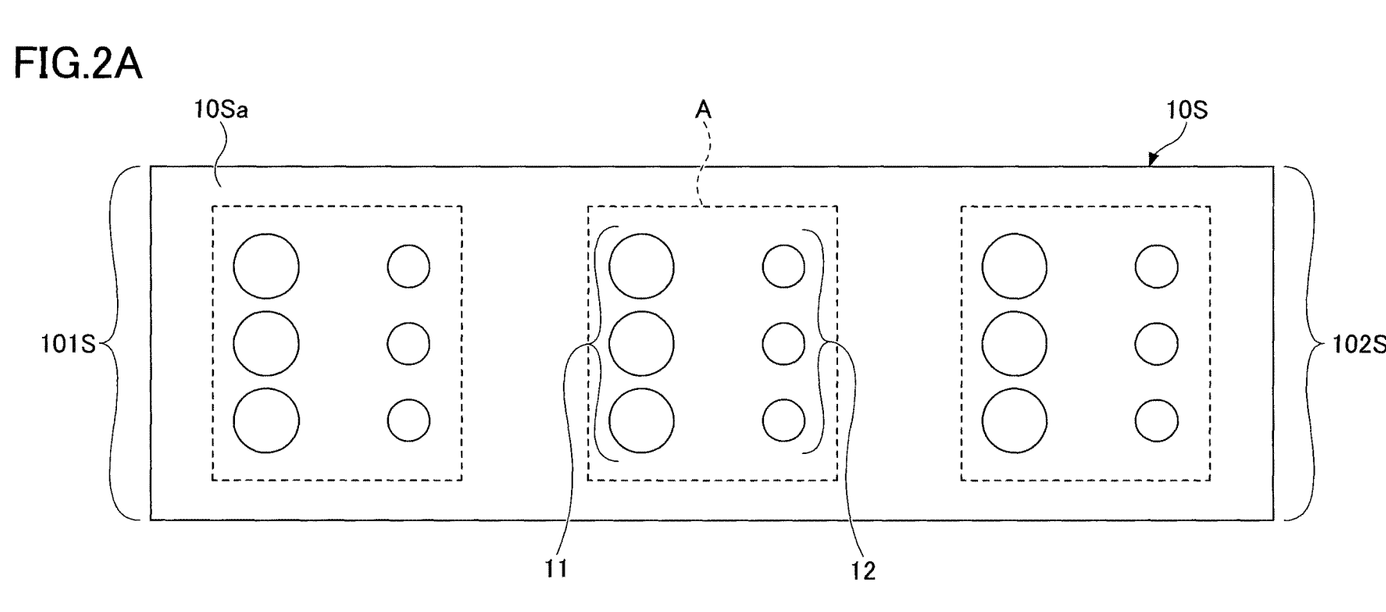
FIGS. 2A and 2B are drawings illustrating an example of a process of making the semiconductor device according to the first embodiment.

In the process step illustrated in FIG. 2A, a sheet interconnect substrate 10S is provided that has a plurality of areas (i.e., three areas in the example illustrated in FIG. 2A), each of which is to become the interconnect substrate 10 upon division into individual pieces. A first surface 10Sa of the interconnect substrate 10S has semiconductor-chip mount areas A in each of which the pads 11 and 12 are disposed. The plan shape of the interconnect substrate 10S is rectangular, for example. The opposite short sides of the interconnect substrate 10S in the plan view are denoted as 101S and 102S.

Figure 2B:
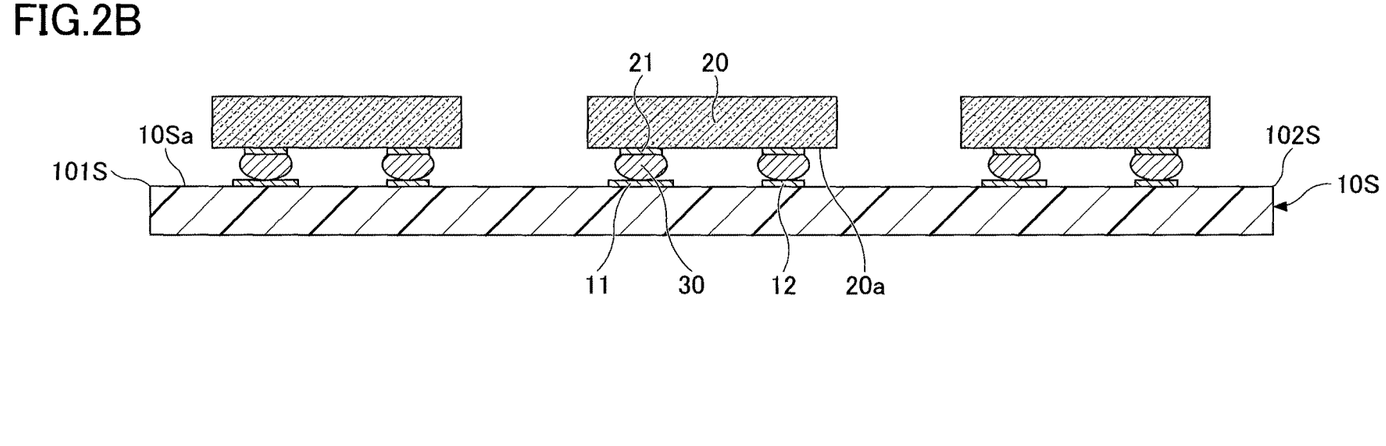

In the process step illustrated in FIG. 2B, a plurality of semiconductor chips 20 are provided, each of which has the electrodes 21 formed on the circuit surface 20a, with the solder bumps 30 being disposed on the electrodes 21. The semiconductor chips 20 are placed on the first surface 10Sa of the interconnect substrate 10S such that the tips of the solder bumps 30 come in contact with the contact surfaces of the pads 11 and 12. All the solder bumps 30 are made of the same material, and have substantially the same amount of protrusion (i.e., height) from the electrodes 21. Namely, the volume of each solder bump 30 is substantially the same.

Figure 3A:
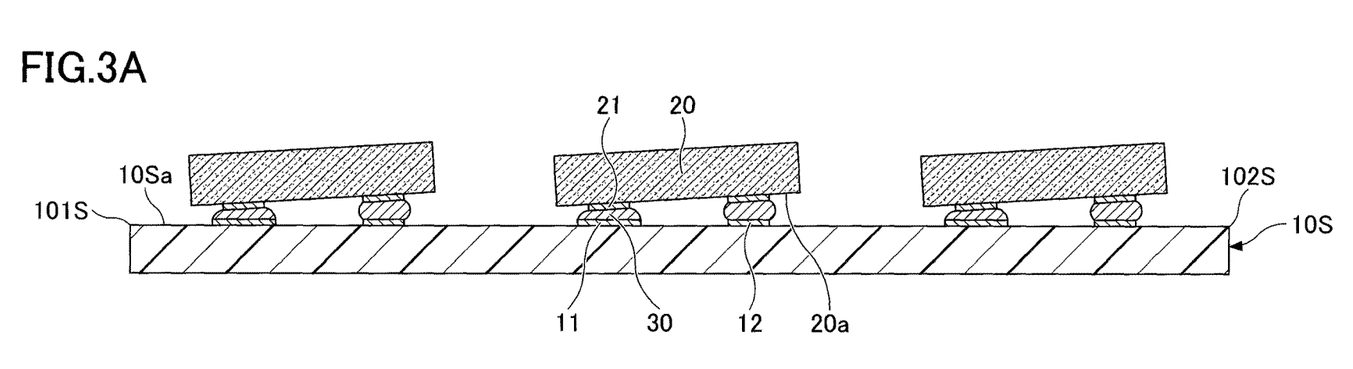
FIGS. 3A and 3B are drawings illustrating an example of the process of making the semiconductor device according to the first embodiment.

In the process step illustrated in FIG. 3A, a reflow process or the like is performed to melt and then harden the solder bumps 30, thereby bonding the electrodes 21 and the pads 11 and 12 at the respective positions through the solder bumps 30. Since the area of the contact surface of the pads 11 is larger than the area of the contact surface of the pads 12, the melted solder bumps 30 horizontally spread wider (i.e., further toward the circumference of the pads) on the pads 11 than on the pads 12. The thickness of the solder bumps 30 on the contact surfaces of the pads 11 thus becomes thinner than the thickness of the solder bumps 30 on the contact surfaces of the pads 12. As a result, each semiconductor chip 20 is mounted on the interconnect substrate 10S such that the distance between the circuit surface 20a and the first surface 10a progressively increases away from the edge 101S toward the edge 102S.

Figure 3B:
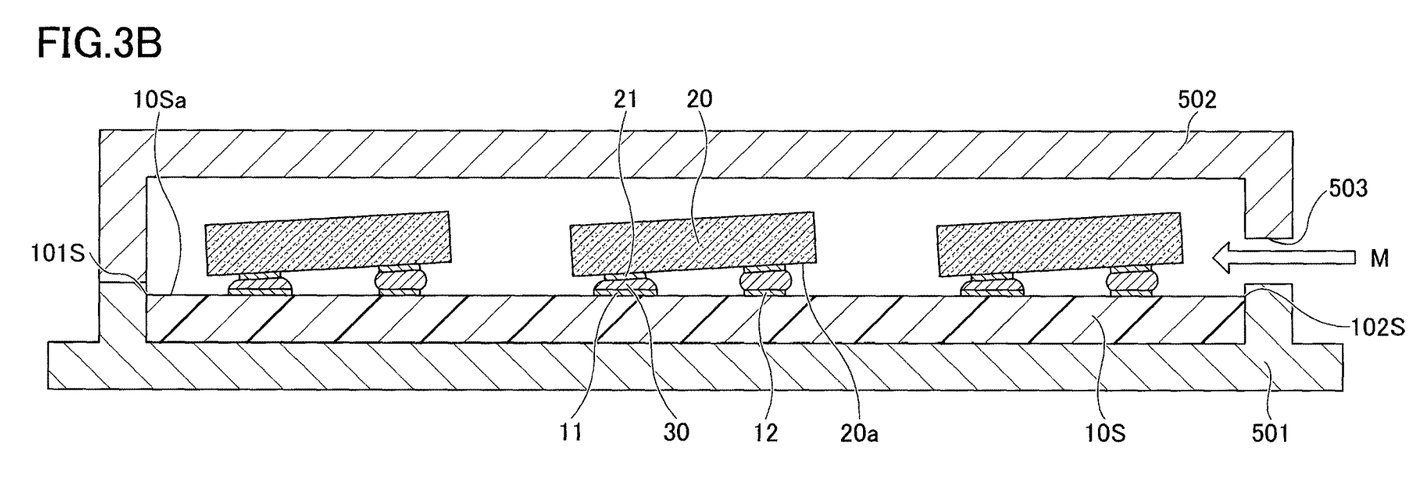

In the process step illustrated in FIG. 3B, a transfer-mold process is performed such that the encapsulating resin 40 is disposed on the first surface 10Sa of the interconnect substrate 10S to encapsulate the semiconductor chips 20 and also to fill the gaps between the circuit surfaces 20a and the first surface 10Sa. Specifically, the structure illustrated in FIG. 3A is inserted into a space confined by a lower mold 501 and an upper mold 502. Pressure is then applied to inject a resin M in a fluid state through an injection opening 503. It may be noted that the structure illustrated in FIG. 3A is placed inside the space defined by the lower mold 501 and the upper mold 502, with the edge 102S being situated toward the injection opening 503. In other words, the resin M is injected from the same side as the edge 102S.

Figure 4A:
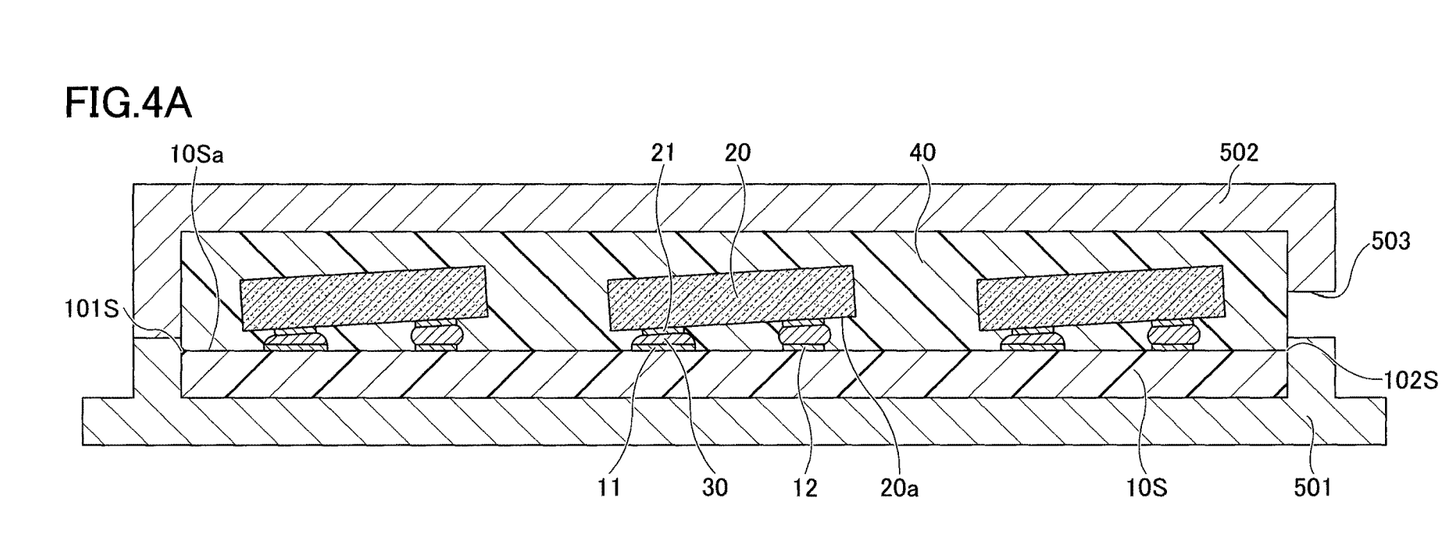
FIGS. 4A and 4B are drawings illustrating an example of the process of making the semiconductor device according to the first embodiment.
Figure 4B:
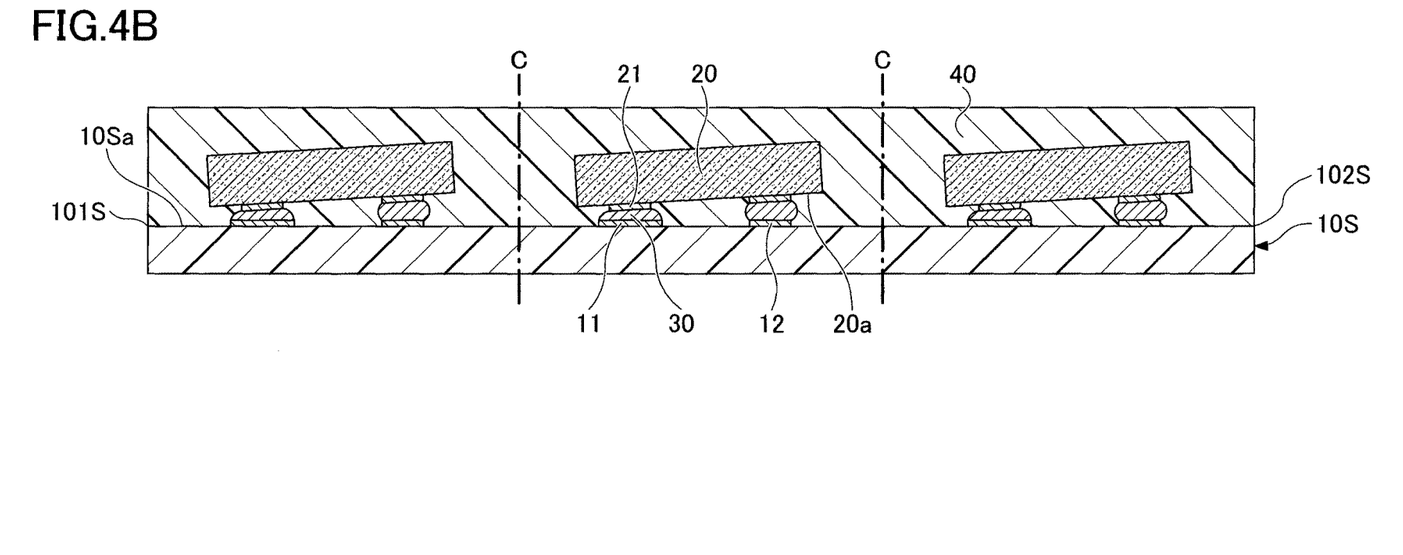

In the process step illustrated in FIG. 4A, the resin M is heated and cured at a predetermined temperature to form the encapsulating resin 40. In the process step illustrated in FIG. 4B, the interconnect substrate 10S having the encapsulating resin 40 formed thereon is removed from the lower mold 501 and the upper mold 502, followed by being cut at cut positions C by use of a dicing blade or the like. In this manner, the semiconductor devices 1 as illustrated in FIG. 1 are obtained.

In the semiconductor device according to the first embodiment, the contact surfaces of the pads to which solder bumps are bonded have varying areas depending on the positions thereof, such that the gap between the circuit surface of the semiconductor chip and the first surface of the interconnect substrate progressively increases from a first side to a second side in a controlled manner. Namely, the tilting of the semiconductor chip mounted on the interconnect substrate is set in a controlled manner. In the process step for forming an encapsulating resin, a resin is injected from the side where the gap between the circuit surface of the semiconductor chip and the first surface of the interconnect substrate is wider, which causes the resin to be reliably injected into the gap between the circuit surface of the semiconductor chip and the first surface of the interconnect substrate. Such an arrangement provides a semiconductor device in which the reliability of resin injection into the gap between a semiconductor chip and an interconnect substrate is improved.

First Variation of First Embodiment

The first variation of the first embodiment is directed to an example in which three or more types of pads having varying contact surface areas are disposed such that the areas of contact surfaces progressively decrease away from the edge 101 toward the edge 102. In connection with the first variation of the first embodiment, a description of the same or similar constituent elements as those of the previously provided descriptions may be omitted as appropriate.

Figure 5A:
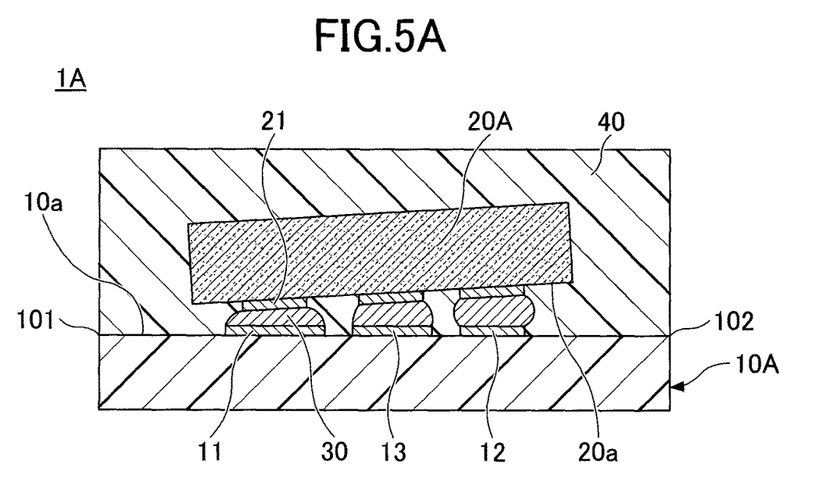
FIGS. 5A and 5B are drawings illustrating an example of a semiconductor device according to a first variation of the first embodiment.
Figure 5B:
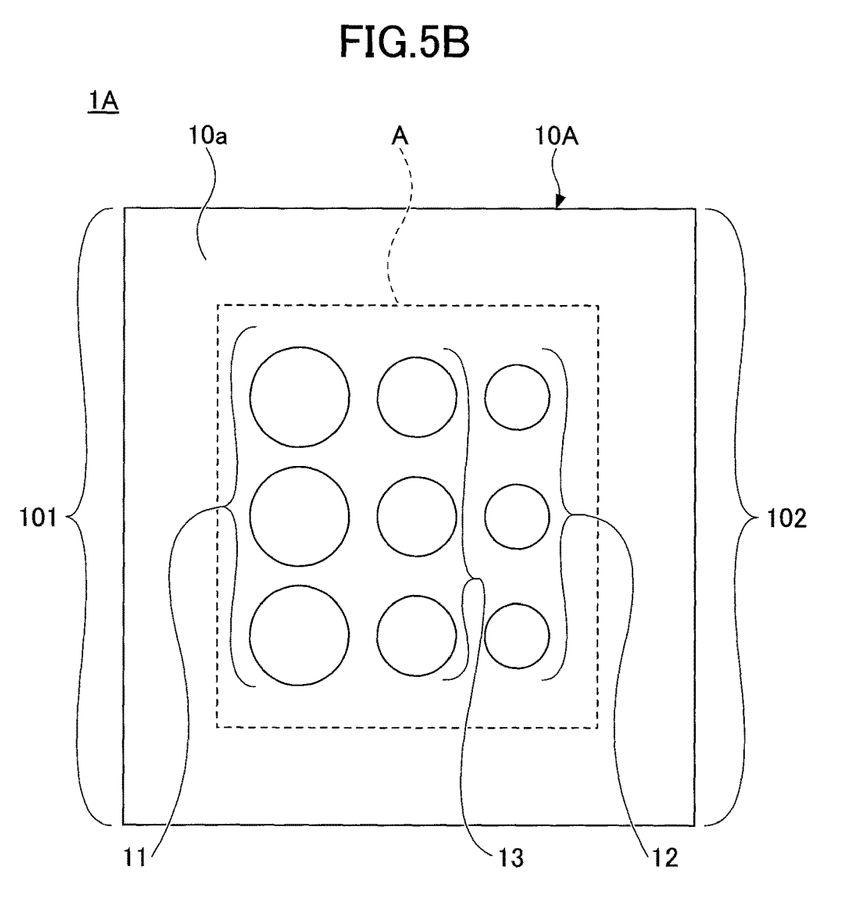

FIGS. 5A and 5B are drawings illustrating an example of the semiconductor device according to the first variation of the first embodiment. FIG. 5A illustrates a cross-sectional view, and FIG. 5B illustrates a plan view of an interconnect substrate 10A and pads 11 through 13 shown in FIG. 5A.

With reference to FIGS. 5A and 5B, a semiconductor device 1A according to the first variation of the first embodiment differs from the semiconductor device 1 (see FIGS. 1A and 1B) in that the interconnect substrate 10 is replaced with the interconnect substrate 10A and in that the semiconductor chip 20 is replaced with a semiconductor chip 20A.

A semiconductor-chip mount area A of the first surface 10a of the interconnect substrate 10A has a plurality of pads formed therein. Specifically, the pads 11 are aligned approximately parallel to an edge 101 of the interconnect substrate 10A in the proximity of the edge 101, and the pads 12 are aligned approximately parallel to an edge 102 of the interconnect substrate 10A in the proximity of the edge 102, which is on the opposite side of the interconnect substrate 10A from the edge 101. Further, pads 13 are disposed between the pads 11 and the pads 12. Three pads 11, three pads 12, and three pads 13 are arranged in this non-limiting example. The numbers of pads 11 through 13 may be determined by taking into account the specifications of the semiconductor chip 20A on which these pads are mounted.

The plurality of pads formed on the first surface 10a of the interconnect substrate 10A have contact surfaces (upper surfaces) that vary in area and that are bonded to the solder bumps. Specifically, the area of the contact surfaces of the pads 12 arranged along the edge 102 is smaller than the area of the contact surfaces of the pads 13 arranged at the center. Further, the area of the contact surfaces of the pads 13 arranged at the center is smaller than the area of the contact surfaces of the pads 11 arranged along the edge 101. The plan view shape of the pads 11 through 13 may be circular, for example. In this arrangement, the pads 13 have a smaller diameter than the pads 11, and the pads 12 have a further smaller diameter than the pads 13.

The semiconductor chip 20A is mounted on the first surface 10a of the interconnect substrate 10A in a flip-chip manner. Specifically, a plurality of electrodes 21 are formed on the circuit surface 20a of the semiconductor chip 20A. The electrodes 21 have contact surfaces (i.e., lower surfaces) that are bonded to the solder bumps and that have a constant area. The plan shape of each electrode 21 is circular, for example. The electrodes 21 situated to face the respective pads 11 are electrically coupled to the pads 11 through the solder bumps 30. The electrodes 21 situated to face the respective pads 12 are electrically coupled to the pads 12 through the solder bumps 30. The electrodes 21 situated to face the respective pads 13 are electrically coupled to the pads 13 through the solder bumps 30.

The semiconductor chip 20A is mounted on the interconnect substrate 10A such that the distance between the circuit surface 20a and the first surface 10a progressively increases away from the edge 101 toward the edge 102. More specifically, the area of the contact surfaces of the pads 11 is larger than the area of the contact surfaces of the pads 13, and the area of the contact surfaces of the pads 13 is larger than the area of the contact surfaces of the pads 12. As a result, at the time of mounting the semiconductor chip 20A on the interconnect substrate 10A, the melted solder bumps horizontally spread wider on the pads 13 (i.e., further toward the circumferences of the pads 13) than on the pads 12, and the melted solder bumps horizontally spread wider on the pads 11 (i.e., further toward the circumferences of the pads 11) than on the pads 13. It follows that the thickness of the solder bumps 30 on the pads 13 decreases in comparison to the thickness of the solder bumps 30 on the pads 12, and the thickness of the solder bumps 30 on the pads 11 decreases in comparison to the thickness of the solder bumps 30 on the pads 13. The semiconductor chip 20A is thus mounted on the interconnect substrate 10A such that the distance between the circuit surface 20a and the first surface 10a progressively increases away from the edge 101 toward the edge 102.

The semiconductor device 1A may be made by the same process steps as the semiconductor device 1.

In this manner, three types of pads may be disposed such that the areas of the contact surfaces progressively decrease away from the edge 101 toward the edge 102. In this case also, the semiconductor chip 20A is mounted on the interconnect substrate 10A such that the distance between the circuit surface 20a and the first surface 10a progressively increases away from the edge 101 toward the edge 102, so that the same advantages as in the first embodiment are provided at the time of forming the encapsulating resin 40.

The configuration in which the three types of pads are disposed such that the areas of the contact surfaces progressively decrease away from the edge 101 toward the edge 102 is not a limiting example. Alternatively, four or more types of pads may be disposed such that the areas of the contact surfaces progressively decrease away from the edge 101 toward the edge 102.

Moreover, pads having the same area may be arranged in plural lines. In FIG. 5B, for example, the pads 12 may be arranged in two or more lines parallel to the edges 101 and 102, and, also, the pads 13 and the pads 11 may be arranged in two or more lines in the same manner. When the pitch of the pads is narrow, such an pad arrangement still allows the semiconductor chip 20A to be mounted on the interconnect substrate 10A such that the distance between the circuit surface 20a and the first surface 10a progressively increases away from the edge 101 toward the edge 102. As a result, the same advantages as in the first embodiment are provided at the time of forming the encapsulating resin 40.

Second Embodiment

The second embodiment is directed to an example in which a semiconductor chip is tilted by a different method than in the first embodiment when mounted on an interconnect substrate. In connection with the second embodiment, a description of the same or similar constituent elements as those of the previously provided descriptions may be omitted as appropriate.

Figure 6A:
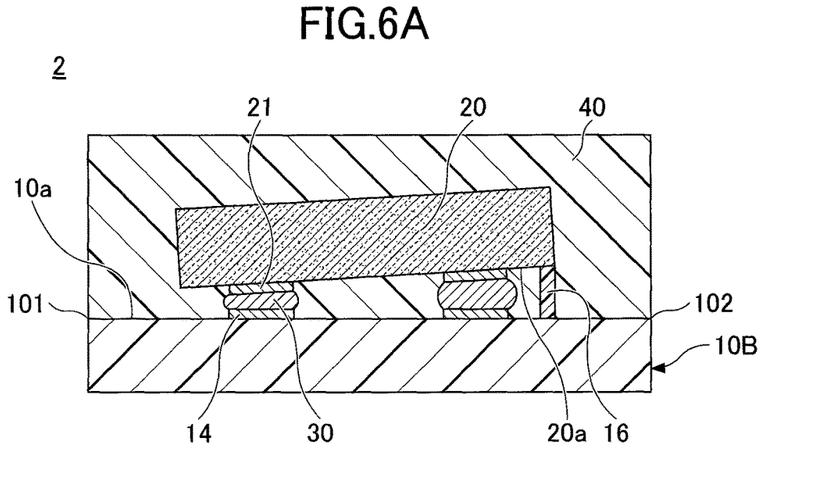
FIGS. 6A and 6B are drawings illustrating an example of a semiconductor device according to a second embodiment.
Figure 6B:
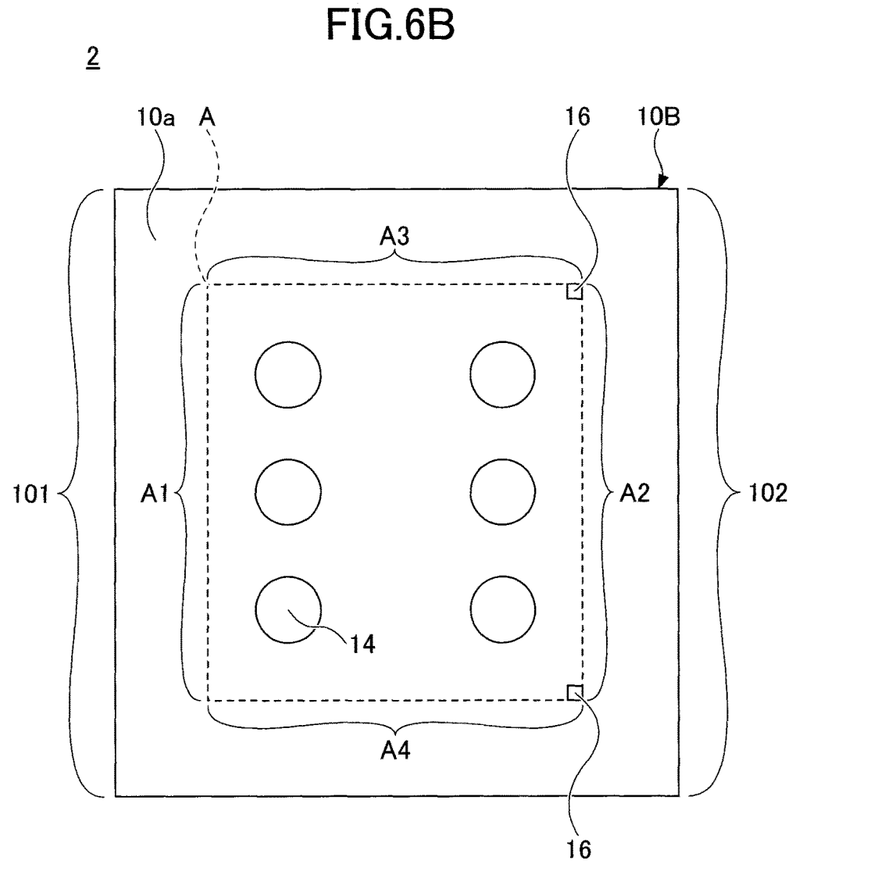

FIGS. 6A and 6B are drawings illustrating an example of the semiconductor device according to the second embodiment. FIG. 6A illustrates a cross-sectional view, and FIG. 6B illustrates a plan view of an interconnect substrate 10B, pads 14, and protrusions 16 shown in FIG. 6A.

In FIG. 6, a semiconductor device 2 of the second embodiment differs from the semiconductor device 1 (see FIGS. 1A and 1B) in that the interconnect substrate 10 is replaced with an interconnect substrate 10B.

A semiconductor-chip mount area A of the first surface 10a of the interconnect substrate 10B has a plurality of pads formed therein. Specifically, the pads 14 are aligned approximately parallel to an edge 101 of the interconnect substrate 10B in the proximity of the edge 101, and the pads 14 are aligned approximately parallel to an edge 102 of the interconnect substrate 10B in the proximity of the edge 102, which is opposite from the edge 101. There are two pad lines, each with three pads 14, in this non-limiting example. The numbers of pads 14 may be determined by taking into account the specifications of the semiconductor chip 20 on which these pads are mounted.

The pads 14 formed on the first surface 10a of the interconnect substrate 10B have contact surfaces (upper surfaces) that have substantially the same area and that are bonded to the solder bumps. The plan shape of the pads 14 may be circular, for example. In this case, the pads 14 have substantially the same diameter.

The protrusions 16 are provided at positions toward the edge 102 in the semiconductor-chip mount area A of the first surface 10a of the interconnect substrate 10B. The protrusions 16, which may be made of a resin, for example, are formed by screen printing or the like. The protrusions 16 are provided for the purpose of determining a gap length between the circuit surface 20a and the first surface 10a. One protrusion may suffice, but two or more protrusions may be preferable for the purpose of providing a stable gap length between the circuit surface 20a and the first surface 10a.

The semiconductor chip 20 is mounted on the first surface 10a of the interconnect substrate 10B in a flip-chip manner such that the distance between a circuit surface 20a and the first surface 10a progressively increases away from the edge 101 toward the edge 102.

In the example illustrated in FIGS. 6A and 6B, the plan shape of the semiconductor chip 20 is rectangular. In the plan view, the circuit surface 20a of the semiconductor chip 20 has a first side situated toward the edge 101, a second side parallel to the first side and situated toward the edge 102, a third side connecting one end of the first side and one end of the second side, and a fourth side connecting the other end of the first side and the other end of the second side.

The plan shape of the semiconductor chip 20 is substantially the same as the plan shape of the semiconductor-chip mount area A. The first side of the circuit surface 20a of the semiconductor chip 20 is situated directly above a first side A1 of the semiconductor-chip mount area A. Further, the second side, the third side, and the fourth side of the circuit surface 20a of the semiconductor chip 20 are situated directly above a second side A2, a third side A3, and a fourth side A4 of the semiconductor-chip mount area A. In the example illustrated in FIGS. 6A and 6B, each of the protrusions 16 is provided at a corresponding corner of the semiconductor-chip mount area A among the corner formed by the second side A2 and the third side A3 and the corner formed by the second side A2 and the fourth side A4. Namely, the upper face of one of the protrusions 16 is in contact with the corner formed by the second side and the third side of the circuit surface 20a of the semiconductor chip 20, and the upper face of the other one of the protrusions 16 is in contact with the corner formed by the second side and the fourth side of the circuit surface 20a of the semiconductor chip 20.

Figure 7A:
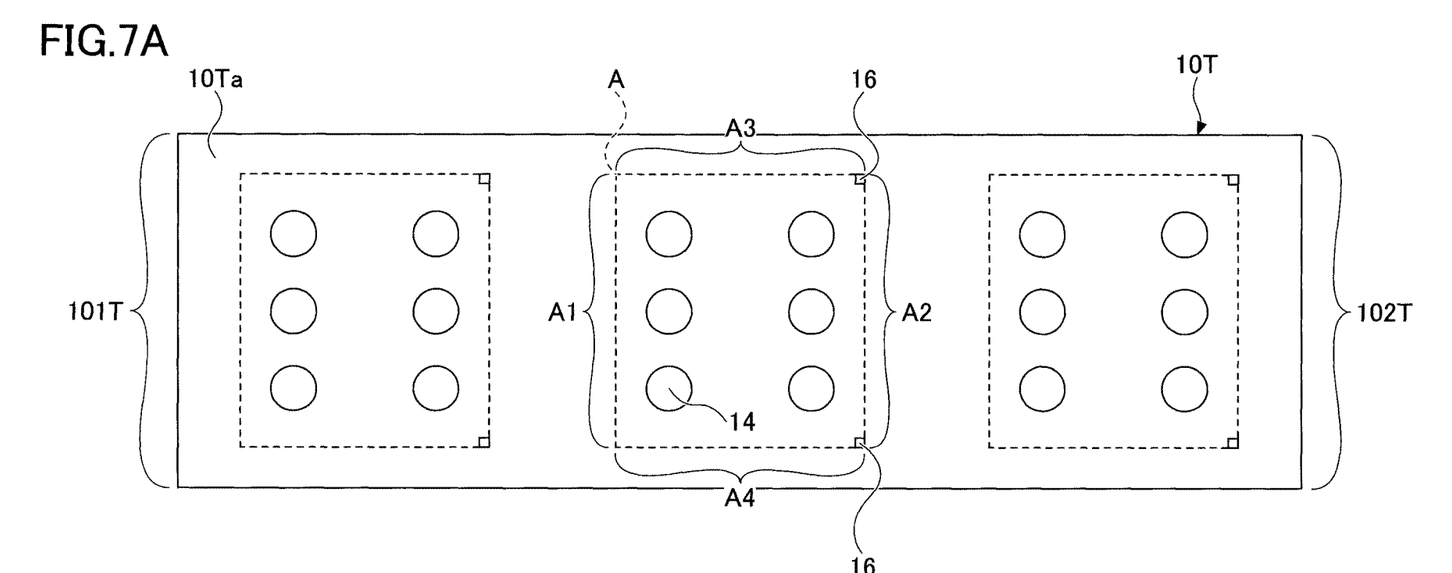
FIGS. 7A and 7B are drawings illustrating an example of a process of making the semiconductor device according to the second embodiment.
Figure 7B:
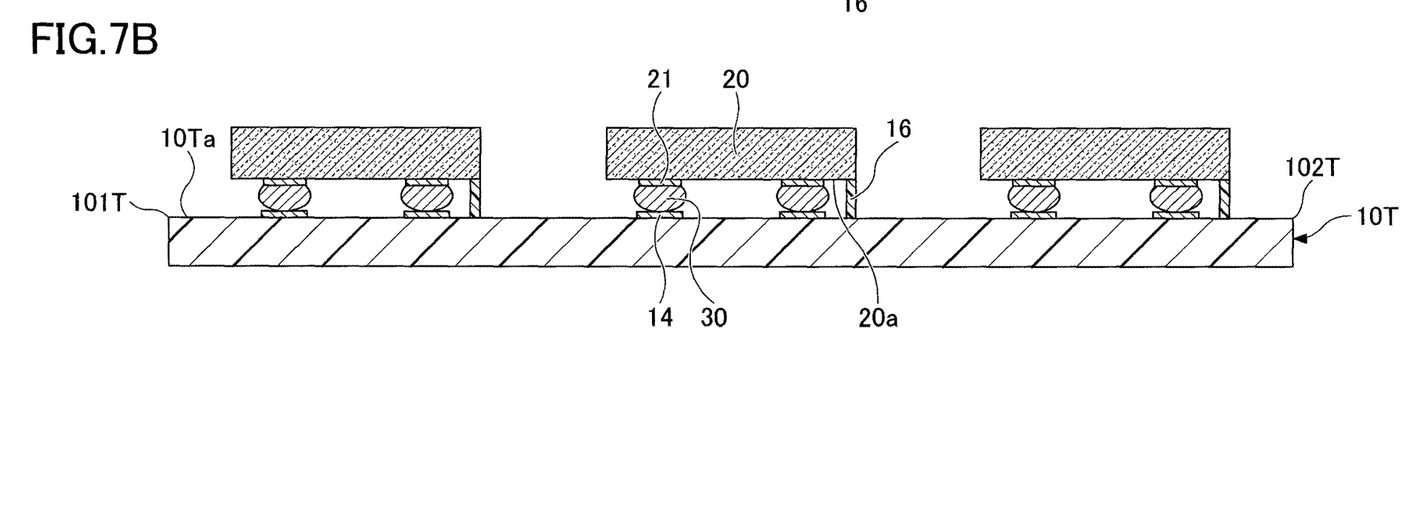
Figure 8:
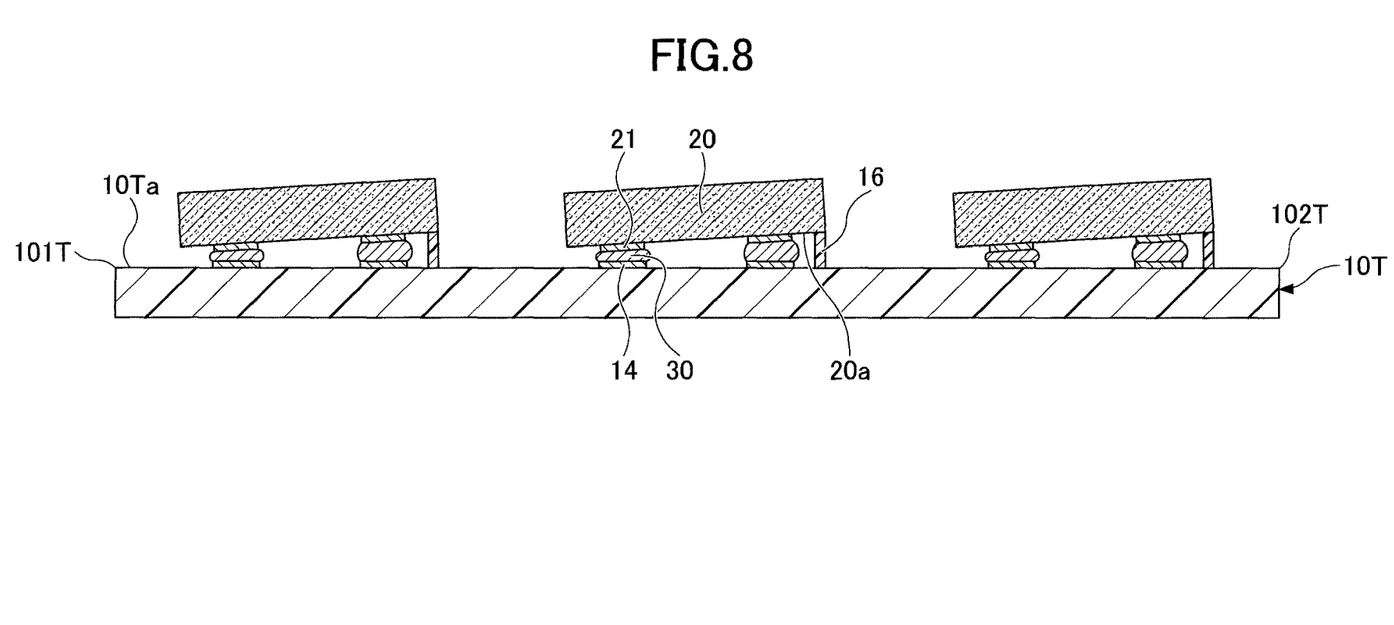
FIG. 8 is a drawing illustrating an example of a process of making the semiconductor device according to the second embodiment.

FIGS. 7A and 7B and FIG. 8 are drawings illustrating examples of process steps for making the semiconductor device according to the second embodiment.

In the process step illustrated in FIG. 7A, a sheet interconnect substrate 10T is provided that has a plurality of areas (i.e., three areas in the example illustrated in FIG. 7A), each of which is to become the interconnect substrate 10B upon division into individual pieces. A first surface 10Ta of the interconnect substrate 10T has semiconductor-chip mount areas A in each of which the pads 14 and the protrusions 16 are disposed. The plan shape of the interconnect substrate 10T may be rectangular, for example. The opposite short sides of the interconnect substrate 10T in the plan view are denoted as 101T and 102T.

In the process step illustrated in FIG. 7B, a plurality of semiconductor chips 20 are provided, each of which has the electrodes 21 formed on the circuit surface 20a, with the solder bumps 30 being disposed on the electrodes 21. The semiconductor chips 20 are placed on the first surface 10Ta of the interconnect substrate 10T such that the tips of the solder bumps 30 come in contact with the contact surfaces of the pads 14. In FIG. 7B, the circuit surface 20a is illustrated as being in contact with the upper faces of the protrusions 16. However, it suffices for the circuit surface 20a to come in contact with the upper faces of the protrusions 16 after the solder bumps 30 are melted. In the process step illustrated in FIG. 7B, the circuit surface 20a does not have to be in contact with the upper faces of the protrusions 16. All the solder bumps 30 are made of the same material, and have substantially the same amount of protrusion (i.e., height) from the electrodes 21. Namely, each solder bump 30 is of substantially equal volume.

In the process step illustrated in FIG. 8, a reflow process or the like is performed to melt and then harden the solder bumps 30, thereby bonding the electrodes 21 and the pads 14 at the respective positions through the solder bumps 30. Because the protrusions 16 are provided at positions toward the edge 102T in each semiconductor-chip mount area A of the first surface 10Ta of the interconnect substrate 10T, the gap length between each circuit surface 20a and the first surface 10Ta at the closest point to the edge 102T is determined by the height of the protrusions 16. In addition, because no protrusions 16 are provided at positions toward the edge 101T, the gap length between each circuit surface 20a and the first surface 10Ta at the position toward the edge 101T is narrower than the gap at the position toward the edge 102T. As a result, each semiconductor chip 20 is mounted on the interconnect substrate 10T such that the distance between each circuit surface 20a and the first surface 10Ta progressively increases away from the edge 101T toward the edge 102T.

Subsequently, the same or similar process steps as in FIG. 3B through FIG. 4B for the first embodiment are performed to produce the semiconductor devices 2 as illustrated in FIGS. 6A and 6B.

In this manner, the area of the pads 14 on the interconnect substrate 10B may be substantially equal, and the protrusions 16 may be provided at the positions toward the edge 102 in the semiconductor-chip mount area A of the first surface 10a. In this case as well, the semiconductor chip 20A is mounted on the interconnect substrate 10B such that the distance between the circuit surface 20a and the first surface 10a progressively increases away from the edge 101 toward the edge 102, so that the same advantages as in the first embodiment are provided at the time of forming the encapsulating resin 40.

It may be noted that the second embodiment may be combined with the first embodiment or with the first variation of the first embodiment.

According to at least one embodiment, a semiconductor device is provided in which the reliability of resin injection into the gap between a semiconductor chip and an interconnect substrate is improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

In addition to the subject matter recited in the claims, the present disclosures include aspects of the subject matter as set out non-exhaustively in the following numbered clauses.

[Clause 1] A method of making a semiconductor device, comprising:

providing an interconnect substrate and a semiconductor chip, the interconnect substrate having a plurality of pads formed on a first surface thereof, the semiconductor chip having a plurality of electrodes formed on a circuit surface thereof, the electrodes having respective bonding members disposed thereon;

mounting the semiconductor chip on the interconnect substrate by placing the semiconductor chip on the first surface such that each of the bonding members comes in contact with a corresponding one of the pads, followed by melting and then hardening the bonding members such that a gap between the circuit surface and the first surface progressively increases from a first side to a second side; and disposing a resin on the first surface to encapsulate the semiconductor chip and to fill the gap between the circuit surface and the first surface, wherein said mounting includes coupling the pads electrically to the electrodes through the bonding members that are made of a same material, and wherein said disposing includes injecting the resin from the second side.

[Clause 2] The method as recited in clause 1, wherein the pads include pads having contact surfaces that are bonded to the bonding member and that have varying areas, wherein the areas of the contact surfaces of the pads are smaller with respect to a pad disposed on the second side than with respect to a pad disposed on the first side, and wherein said mounting includes mounting the semiconductor chip such that thicknesses of the mounting members on the contact surfaces are thinner with respect to the pad disposed on the first side than with respect to the pad disposed on the second side.

[Clause 3] The method as recited in clause 2, wherein the pads include three or more types of pads that have respective, different contact surface areas, and the three or more types of pads are arranged such that the contact surface areas progressively decreases from the first side to the second side.

[Clause 4] The method as recited in clause 1, wherein one or more protrusions are provided on the interconnect substrate on the second side, and wherein said mounting includes mounting the semiconductor chip such that a same side of the circuit surface as the second side comes in contact with the one or more protrusions.

[Clause 5] The method as recited in clause 4, wherein a plan shape of the semiconductor chip is rectangular, wherein in a plan view, the circuit surface has a first edge situated on a same side as the first side, a second edge parallel to the first edge and situated on a same side as the second side, a third edge connecting one end of the first edge and one end of the second edge, and a fourth edge connecting another end of the first edge and another end of the second edge, and wherein the one or more protrusions include two protrusions that are disposed at respective corners, the corners being a corner formed by the second edge and the third edge and a corner formed by the second edge and the fourth edge.

What is claimed is:

1. A semiconductor device, comprising:
   an interconnect substrate having a plurality of pads formed on a first surface thereof;
   a semiconductor chip having a plurality of electrodes formed on a circuit surface thereof, the semiconductor chip being mounted on the interconnect substrate such that the circuit surface faces the first surface;
   a plurality of bonding members that are made of a same material and that electrically couple the pads and the electrodes; and
   a resin disposed on the first surface to encapsulate the semiconductor chip and to fill a gap between the circuit surface and the first surface,
   wherein the semiconductor chip is mounted on the interconnect substrate such that the gap between the circuit surface and the first surface progressively increases from a first side to a second side, wherein the pads include pads having contact surfaces that are bonded to the bonding members, and wherein the areas of the contact surfaces of the pads are smaller with respect to a pad disposed on the second side than with respect to a pad disposed on the first side.

2. The semiconductor device as claimed in claim 1, wherein the pads include three or more types of pads that have respective, different contact surface areas, and the three or more types of pads are arranged such that the contact surface areas progressively decrease from the first side to the second side.

3. A semiconductor device, comprising:
- an interconnect substrate having a plurality of pads formed on a first surface thereof;
- a semiconductor chip having a plurality of electrodes formed on a circuit surface thereof, the semiconductor chip being mourned on the interconnect substrate such that the circuit surface faces the first surface;
- a plurality of bonding members that are made of a same material and that electrically couple the pads and the electrodes; and
- a resin disposed on the first surface to encapsulate the semiconductor chip and to fill a gap between the circuit surface and the first surface,
- wherein the semiconductor chip is mounted on the interconnect substrate such that the gap between the circuit surface and the first surface progressively increases from a first side to a second side,
- wherein the semiconductor device further comprises one or more protrusions situated on the second side, between the circuit surface and the first surface.

4. The semiconductor device as claimed in claim 3, wherein a plan shape of the semiconductor chip is rectangular,
- wherein in a plan view, the circuit surface has a first edge situated on a same side as the first side, a second edge parallel to the first edge and situated on a same side as the second side, a third edge connecting one end of the first edge and one end of the second edge, and a fourth edge connecting another end of the first edge and another end of the second edge, and
- wherein the one or more protrusions include two protrusions that are disposed at respective corners, the corners being a corner formed by the second edge and the third edge and a corner formed by the second edge and the fourth edge.

* * * * *